(12) United States Patent
Natarajan et al.

(10) Patent No.: US 6,319,554 B1
(45) Date of Patent: *Nov. 20, 2001

(54) METHOD AND APPARATUS FOR SURFACE METALLIZATION

(75) Inventors: Govindarajan Natarajan, Pleasant Valley; Robert W. Pasco, Wappingers Falls, both of NY (US)

(73) Assignee: International Business Machine Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/329,893

(22) Filed: Jun. 10, 1999

(51) Int. Cl.[7] .................................................. C23C 16/08
(52) U.S. Cl. .......................... 427/252; 427/253; 427/124
(58) Field of Search ................................ 427/252, 253, 427/124

(56) References Cited

U.S. PATENT DOCUMENTS 4,590,095   5/1986   Park .
4,664,942 * 5/1987   Park .
5,869,134 * 2/1999   Reddy et al. .

* cited by examiner

Primary Examiner—Timothy Meeks
(74) Attorney, Agent, or Firm—Joseph P. Abate

(57) ABSTRACT

The present invention relates generally to a CVD (Chemical Vapor Deposition) process where at least one source metal, such as, nickel (Ni) or alloys thereof, for example, Ni/Cu, Ni/Co, are deposited on metal surfaces which are capable of receiving the source metal, such as, refractory metal, for example, molybdenum, tungsten or alloys thereof, using at least one gaseous Iodide source, such as, an iodic fluid, for example, hydriodic acid gas. The source metal is securely held in place by at least one high strength inert material. The CVD of nickel or alloys thereof, on the surface of refractory metal, such as, molybdenum (Mo) or tungsten (W), where the nickel source is physically isolated from the refractory metal surface to be plated using at least one high strength inert material that is in physical floating contact with the refractory metal surface that needs to be coated with at least one layer of nickel or alloy thereof, and where the nickel source and the high strength inert material are embodied as a single bonded structure.

22 Claims, 1 Drawing Sheet

METHOD AND APPARATUS FOR SURFACE METALLIZATION

FIELD OF THE INVENTION

The present invention relates generally to a CVD (Chemical Vapor Deposition) process where at least one source metal, such as, nickel (Ni) or alloys thereof, for example, Ni/Cu, Ni/Co, are deposited on metal surfaces which are capable of receiving the source metal, such as, refractory metal, for example, molybdenum, tungsten or alloys thereof, using at least one gaseous Iodide source, such as, an iodic fluid, for example, hydriodic acid gas. The source metal is securely held in place by at least one high strength inert material. The CVD of nickel or alloys thereof, on the surface of refractory metal, such as, molybdenum (Mo) or tungsten (W), where the nickel source is physically isolated from the refractory metal surface to be plated using at least one high strength inert material that is in physical floating contact with the refractory metal surface that needs to be coated with at least one layer of nickel or alloy thereof, and where the nickel source and the high strength inert material are embodied as a single bonded structure.

BACKGROUND OF THE INVENTION

In the electronics industry it is often desirable to cover or coat an existing refractory metal surface with a brazable or solderable surface. Applications for such a procedure, include but are not limited to, I/O pads, wire bond pads, C4's (Controlled Collapse Chip Connection), seal bands, to name a few.

Many methods are available and practiced in the industry to cover or coat an existing refractory metal surface with a brazable or solderable surface. The most commonly used approach for treating refractory metal surfaces in the microelectronic packaging business is to employ electroplating or electroless-plating of pure or substantially pure Ni (nickel) film from an aqueous bath which is at or near room temperature.

Nickel is generally the metal of choice for plating refractory metals because it can be made to bond well with any of the refractory metals. In addition, Ni possesses good wetting characteristics for subsequent bonding processes, such as brazing or soldering, and it has excellent corrosion characteristics.

Recently, a few high temperature, dry, halide transfer processes have been disclosed and subsequently used by the industry for the purpose of plating nickel on molybdenum or tungsten.

One method disclosed in U.S. Pat. No. 4,590,095 (Park) uses a pack cementation approach. The essential elements for pack cementation are a powder metal source, an activator, and an object to be plated. Basically, the elements are placed in a chamber and the object is buried in a mixture of the powder metal source, activator, and usually an inert ceramic powder, such as, alumina, and then heated to a high temperature to establish vapor transport. The process allows for mass transfer of the gas species. For the Park process pure nickel powder was used as the metal source and the activator used was ammonium iodide powder.

A departure from this pack cementation approach for a halide transfer process was disclosed in U.S. Pat. No. 4,664,942 (Park). In this case ammonium iodide powder and pure nickel were still the essential elements for the halide transfer process. However, in this case nickel screens were used as the metal source rather than the nickel powder. And, the objects to be plated, containing exposed surfaces of refractory metal, were placed in stacks with the nickel screens acting as separators in the reaction vessel or work boat. The ammonium iodide activator for the process was held in a separate crucible within the work boat. The elements were again heated to a high temperature to establish vapor transport. The open nickel screen allowed for mass transfer of the gas species and also served as the nickel source.

Most recently, another improvement was put forward in U.S. patent application Ser. No. 08/668,295 (Reddy et al.), filed on Jun. 21, 1996, entitled "CVD OF METALS CAPABLE OF RECEIVING NICKEL OR ALLOYS THEREOF USING IODIDE", presently U.S. Pat. No. 5,869,134, issued Feb. 2, 1999 assigned to the assignee of the instant Patent Application, and the disclosure of which is incorporated herein by reference, where CuI powder was disclosed as a preferred iodide activator providing various advantages.

Another improvement that has been proposed in U.S. Patent Application Ser. No. 09/050,491, filed on Mar. 30, 1998, entitled "CVD OF METALS CAPABLE OF RECEIVING NICKEL OR ALLOYS THEREOF USING INERT CONTACT", assigned to the assignee of the instant Patent Application, and the disclosure of which is incorporated herein by reference, where at least one inert material is in a floating contact with the receiving metal, and the inert material provides physical separation between the source metal and the receiving metal.

DP (Dry Process) nickel process as it exists in prior art is basically a halide transfer process where nickel metal is transported in the gas phase from a solid nickel source and deposited as a solid metallic film on a refractory metal surface. The halide used in this case is a solid compound of iodide. Ideally the reaction will be made to take place in a closed container which in general is not tightly sealed.

In general, for halide transfer metal deposition processes, it is very desirable that the metal source material, preferably, a substantially pure solid nickel source, and the refractory metal area to be plated are kept in close physical proximity to each other. This close proximity condition is necessary in order to maintain a reasonable rate of metal deposition during the process.

In the prior art halide transfer processes, referenced above, the metal source material, powder or screens, were kept in close physical proximity to the refractory metal surface to be plated. However, in addition, due to the specific geometrical configuration of each assembly, the metal source material can at least at some point, also come into direct physical contact with the metal surface to be plated. It has been discovered that when the source metal and the target areas to be plated do touch each other, during the deposition process, while using these known processes, they, the source and the sink, can weld together and form a bond. When the nickel plated part and the other assembly materials are subsequently separated, after the deposition process has been completed, a defect in the deposited nickel film can be readily observed. This defect can take the form of a taffy pull of metal or a piece of metal debris or a missing section of the deposited nickel film, etc. This condition will normally, result in the rejection of the part or work piece.

Another improvement that has been proposed in U.S. patent application Ser. No. 09/050,490, filed on Mar. 30, 1998, entitled "CVD OF METALS CAPABLE OF RECEIVING NICKEL OR ALLOYS THEREOF USING AN INERT STRUCTURE WITH EMBEDDED NICKEL OR ALLOYS THEREOF", assigned to the assignee of the instant Patent Application, and the disclosure of which is incorporated herein by reference, where at least one source metal is secured to at least one inert material and where the source metal is in a floating contact with the receiving metal, and the inert material provides physical separation between the source metal and the receiving metal.

The present invention, however, teaches an improvement over the prior art, where an iodide source which is free of any extraneous metal contaminants is used in the DP nickel process. Here, the iodide source in a new physical form, namely gaseous form is used in the manufacturing process. This provides additional process controls such as pressure and concentration, and flow and gas phase distribution of the source metal, such as, nickel, through the inert structure for improving the reliability and yield of the halide transfer process where the source metal, such as, nickel metal, is electrolessly deposited onto a refractory metal surface.

With the method of this invention the metal source and the refractory metal surface to be plated, are kept in close physical proximity, as required, to effect rapid deposition rate which is also enhanced by the gas phase iodide source such as hydriodic acid and the reaction pressure above ambient. In addition, the inventive process allows substantial lowering of the transfer reaction temperature. The lower deposition temperature allows lower cost processing, which in turn improves the reliability of the coating. Furthermore, the lower process temperature also reduces the undesirable reactions of the materials in the pressure chamber.

It is preferred with the method of this invention that the high strength inert standoff material embodies or is bonded or attached to the metal source, so that the high strength inert standoff material and the metal source can be handled conveniently as a single unit. Preferably, the inert standoff material is in contact with, or in close proximity to, the receiving metal surface.

During the process the inert material continues to provide complete physical isolation between the source metal and the surface being plated, such that there is no opportunity for the source metal and the receiving metal to touch and weld or to form a bond creating a defect.

Furthermore, in this present invention the gaseous species is the accelerator and hence can accelerate and control the gas phase reaction. This will sweep the source metal surface in a continuous manner and will influence relatively faster kinetics at relatively lower temperature, thus the deposition kinetics can further be accelerated by increasing the pressure and/or temperature, etc.

PURPOSES AND SUMMARY OF THE INVENTION

The invention is a novel apparatus and process where a source metal, such as, nickel or alloys thereof, is deposited on refractory metal surfaces using a CVD (Chemical Vapor Deposition) process using at least one iodic fluid, such as, hydriodic acid, and at least one high strength inert standoff in contact with the receiving metal surface to physically isolate the nickel source, where the nickel source and the high strength inert standoff are secured to each other into a single unit.

Therefore, one purpose of this invention is to provide an apparatus and a process that will provide a deposition of nickel or alloys thereof, on refractory metal surfaces with hydriodic acid, preferably at higher than ambient pressure, as the active reagent, using at least one high strength inert standoff in contact with the receiving metal surface to physically isolate the nickel source where the inert standoff and the nickel source are secured to each other.

Another purpose of this invention is to remove any defects associated with contaminants from source metallic salts.

Yet another purpose of this invention is to provide a low cost process using high pressure and/or low temperature gas phase reaction method and apparatus.

Therefore, in one aspect this invention comprises a process for depositing at least one source metal onto at least one receiving metal, wherein said receiving metal is secured to a substrate, comprising the steps of:

(a) placing said substrate containing said receiving metal in a pressure chamber containing at least one source metal, and wherein at least a portion of at least one inert material is secured to said source metal, (b) introducing at least one iodic fluid in said pressure chamber, (c) heating said pressure chamber and its contents in a non-oxidizing environment at a temperature in the range from between about 25° C. to about 1,000° C., for a period of time ranging to a maximum of about 200 minutes, (d) allowing said pressure chamber and its contents to cool so that said receiving metal has at least one layer of said source metal adhered thereto, and (e) removing said substrate containing said adhered layer of source metal to said receiving metal, from said pressure chamber.

In another aspect this invention comprises a process for depositing nickel or alloys thereof on at least one receiving metal, wherein said receiving metal is secured to a substrate, comprising the steps of:

(a) placing said substrate containing said receiving metal in a pressure chamber containing at least one discrete nickel or alloy thereof and at least one iodic fluid as at least one iodide source, and wherein at least a portion of at least one inert material is secured to said at least one discrete nickel or alloy thereof, (b) heating said pressure chamber and its contents in a non-oxidizing environment at a temperature in the range from between about 25° C. to about 1,000° C., for a period of time ranging to a maximum of about 200 minutes, (c) allowing said pressure chamber and its contents to cool so that said receiving metal has at least one layer of said nickel or alloy thereof adhered thereto, and (d) removing said substrate containing said adhered layer of nickel or alloy thereof to said receiving metal, from said pressure chamber.

In yet another aspect this invention comprises an apparatus comprising a container containing, at least one substrate having at least one receiving metal secured thereto, and at least one inert material secured to at least one source metal, and wherein said at least one inert material physically separates said at least one source metal from said at least one receiving metal, and at least one iodic fluid.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

This invention basically discloses a gas phase halide transfer reaction process with increased process windows in temperature and pressure for manufacturability. Also, this invention provides for physical isolation between the metal source and the area for metal deposition, but concurrently maintains a very close proximity of the two in order to allow for efficient, uniform, and timely progress of the transfer process. However, the metal source is physically separated from the receiving metal, such as, by using at least one porous ceramic standoff. It is preferred that the source metal is secured to the inert material such that they can be conveniently handled as a single unit.

In this invention the preferred source metal to be transferred and deposited is nickel or nickel alloy. The target area to be plated with nickel is refractory metal, such as, tungsten or molybdenum, and the accelerator for the transfer process is hydriodic acid with or without a carrier gas. However, the intrinsic intent of the invention is to use additional process control parameters such as pressure and temperature. It has been found that the hydriodic acid process eliminates any metal contaminants and also provides additional process controls, such as, pressure and concentration and thereby lowering the process temperature without compromising the kinetics.

It has also been found that the halide transfer is not significantly impeded when the source metal and the target deposition area are not in direct physical contact, but that the source metal and the target area are in close physical proximity. This is done, according to the present invention, by creating a structure where at least one porous inert standoff and at least one source metal is integrated to form a high strength setter tile, such that the porous body distributes the reactants uniformly and allows the product gases to be swept away from the source metal, as the hydriodic acid gas concentration is always controlled and known, as it is fed and not produced by any external reactions.

It has been found that the hydriodic acid in the ambient gas reacts with nickel or alloy thereof to create nickel iodide and hydrogen, which reaction after the deposition of nickel or alloy thereof on the refractory metal surface, changes back into hydriodic acid in the ambient, per the following reaction:

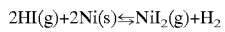

$$2HI(g) + 2Ni(s) \rightleftharpoons NiI_2(g) + H_2$$

Figure 1:
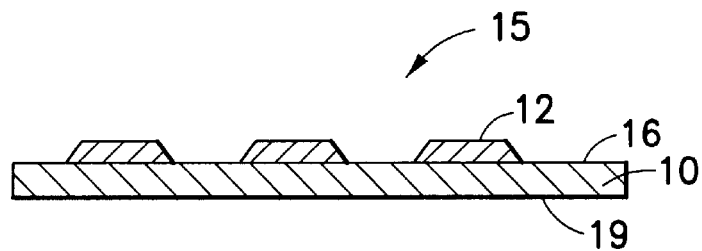
FIG. 1, illustrates a cross-sectional view of a structure showing a refractory metal that needs a metal deposition.

FIG. 1, illustrates a cross-sectional view of a structure 15, showing at least one refractory metal 12, that needs a metal deposition. Basically, on a substrate 10, having a first surface 16, and a second surface 19, at least one refractory metal 12, is formed by methods well known in the art to create the structure 15. As stated earlier that in the electronics industry it is often desirable to cover or coat the surface of an existing refractory metal 12, with at least one brazable or solderable material 14.

Figure 2:
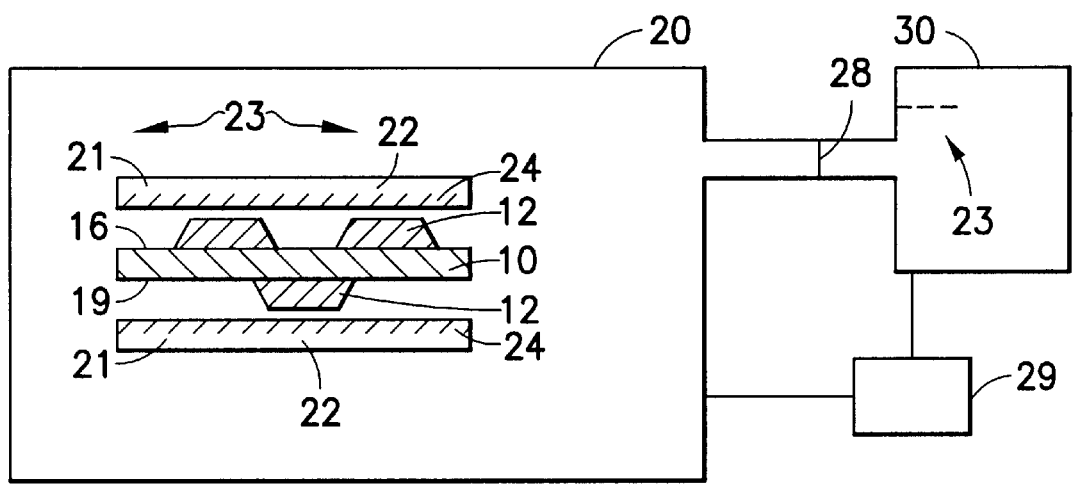
FIG. 2, illustrates a cross-sectional view of a preferred apparatus used in this invention.

FIG. 2, shows a configuration of a reaction vessel 20, to be used for the halide transfer process where the metal source 24, and area to be plated 12, such as, a refractory metal pad 12, are held isolated, and where the metal source 24, and the means for providing for physical isolation between the metal source 24, and the receiving metal 12, are incorporated into a single item, to form the DP setter 21, or DP tile 21.

FIG. 2, further illustrates a preferred apparatus of this invention where a boat or container or box or chamber 20, contains at least one DP setter 21, or DP tile 21, having at least one deposition metal source 24, preferably, a nickel or a nickel alloy 24, secured to at least one inert material 22. As shown in FIG. 2, a DP tile or DP setter 21, providing at least one inert standoff 22, for a receiving metal, incorporating at least one source metal material 24.

The ceramic body 10, has at least one receiving or refractory metal feature 12, such as, an I/O pad or wire bond pad or seal band or a line, or a terminal via, to name a few, on the first surface 16, and/or at least one receiving or refractory metal feature 12, such as, an I/O pad or wire bond pad or seal band or a line, or a terminal via, to name a few, on the second surface 19, of the ceramic substrate or body 10.

The deposition metal source 24, as shown in FIG. 2, basically, could be nickel particles 24, which are randomly distributed within the inert material 22, and which would be sufficient to assist in completing the process. Or alternatively, the metal source 24, could be a fully interconnected nickel phase, or it could also be non-uniform in nickel phase concentration in order to provide an optimum overall configuration of the DP setter 21. In addition, one could have more than one deposition metal source 24, such as, a first or upper deposition metal source 24, and a second or a lower deposition metal source 24, facing the second surface 19. For the purposes of illustration only, the deposition metal source 24, may be referred to as randomly distributed nickel particles 24.

Preferably an iodic fluid 23, is kept in a separate chamber or container 30, and is released into the chamber 20, using at least one valve means 28. At least one computer or electronic device 29, could be connected to the chambers 20 and/or 30, to control and/or monitor the inventive process. The device 29, could also be used to control the pressure in the chamber 20, the volume rate of the iodic fluid 23, the concentration of the iodic fluid 23, the temperature of the iodic fluid 23, etc. It is preferred that the iodic fluid is a gas, however, it could be a liquid. To obtain better results it has been found that the iodic fluid 23, comprise at least one iodic acid, such as, hydriodic acid, and at least one inert gas and/or reducing gas.

It is preferred that at least one component of the at least one iodic fluid 23, be selected from a group comprising hydriodic acid or hydriodic acid forming fluid mixtures, to name a few.

Figure 3:
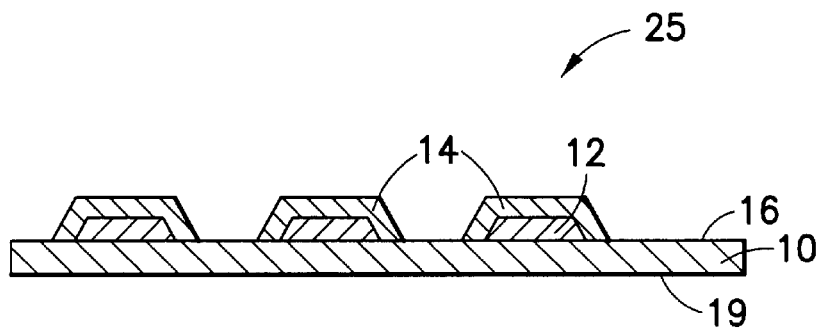
FIG. 3, illustrates a cross-sectional view of the preferred structure of this invention after it has gone thorough at least one metal deposition cycle.

FIG. 3, illustrates a cross-sectional view of the preferred structure 25, of this invention after it has gone thorough at least one metal deposition cycle, where the substrate 10, such as, a ceramic substrate 10, has at least one refractory metal 12, such as, for example, tungsten, molybdenum, etc., having at least one layer of at least one deposition metal 14, such as, a nickel or nickel alloy 14.

The material for the deposition metal source 24, could be selected from a group comprising pure Ni or Ni/cobalt alloy or Ni/copper alloy, to name a few. The material for the deposition metal source can be of any shape, size, or configuration, including powder, however, the preferred embodiment has nickel particles 24, which are randomly distributed throughout the inert material 22.

The preferred refractory metal 12, is selected from a group comprising molybdenum, tungsten, or alloys or compounds thereof, including mixtures with other materials, such as, WC—Co.

The specific halide transfer process used to effect nickel plating could be any of several processes currently in use. However, in general the constituents of the reaction assembly, the item incorporating metal source and inert standoff, activator, and surface to be plated, are built into a reaction vessel or work boat and then heated to a temperature high enough to effect a significant rate of gas phase transport of the metal source. For the case of hydriodic acid as the activator, and nickel metal as the source to be deposited on a refractory metal surface, such as, tungsten or molybdenum, one preferred heating profile would be to heat the contents from room temperature to between about 25° C. and about 1000° C., and then to hold the deposition process at this peak temperature for a time period from between about 1 minutes to about 200 minutes.

The reaction temperature depends upon the chamber pressure. It is preferred that pressures less than about 5 atmospheres, and hydriodic acid concentration of up to about 100 percent be used to carry out this inventive process. However, for some applications one could have pressures between about 1 atmosphere to about 20 atmospheres.

Using this Chemical Vapor Deposition process, and incorporating the DP setter providing isolation and metal source, Ni and/or Ni-alloy films can be built upon the surfaces of the refractory metal 12, without defects. The thickness of the deposited nickel layer 14, can be from between about 0.01 microns to layer thicknesses exceeding about 10–15 microns.

The porous setter tile 21, provides multiple functions, firstly, it provides and maintains the source metal 24, in close proximity to the surface of the receiving metal 12, secondly, for providing for physical isolation between the source metal 24, and the receiving metal 12, using a high strength inert material 22, thirdly, for providing for mechanical strength during multiple reuse, and fourthly, for distributing the fresh gas 23, and for the easy removal of the product gases.

The DP setter 21, needs to be configured such that the passage of gas between the metal source 24, and the receiving metal 12, is not significantly impeded. Gas species 23, must be allowed to travel between the source metal 24, and the deposition surface in order to effect plating. In addition, the inert material 22, integrated into the DP setter 21, configuration needs to be non-reactive to the iodide environment 23, and the inert material 22, is preferably, alumina, carbon (graphite), silica, zirconia, glass, and combinations thereof.

Construction of the DP setter 21, or DP tile 21, incorporating both inert standoff 22, and the metal source 24, and supplying other necessary function as described above, can be done in any of several different ways. One such process is disclosed in U.S. patent application Ser. No. 09/050,490, filed on Mar. 30, 1998, entitled "CVD OF METALS CAPABLE OF RECEIVING NICKEL OR ALLOYS THEREOF USING AN INERT STRUCTURE WITH EMBEDDED NICKEL OR ALLOYS THEREOF", assigned to the assignee of the instant Patent Application, and the disclosure of which is incorporated herein by reference, where at least one source metal is secured to at least one inert material and where the source metal is in a floating contact with the receiving metal, and the inert material provides physical separation between the source metal and the receiving metal.

Thus, while acting as a source of metal in the DP Nickel process, the fully dense DP setter provides nickel access to the iodide environment at its surface initially and subsequently provides nickel access to the iodide environment below its surface through porous paths created by the consumption of nickel source atoms in the plating process.

The DP setter 21, could be constructed, such that the metal source 24, is a thin plate or foil 24, and on the surface of this plate or foil 24, are secured loose inert particles 22, of appropriate size and shape. In this way the metal plate or foil 24, will act as metal source 24, and the particles attached to its surface act as inert standoff 22.

Another configuration for the DP setter 21, could be to have the metal source 24, as a metal mesh screen 24, or perforated metal foil 24, where the screen or foil is incorporated into a porous inert material 22, such as, alumina, glass, etc. It should be appreciated that this process is very similar to the one used for constructing MLC substrates.

For cost purposes, and also for certain quality and reliability constraints, it is desirable that the source material 24, such as, a nickel foil 24, be used multiple times, may be as many as 20 or more times, before it is discarded. When a DP setter 21, is used, this transfer of an etched mosaic pattern to the deposited nickel film 24, is greatly reduced or completely removed such that it is no longer a concern. Consequently, a previously used DP setter 21, containing nickel 24, can be reused to plate large land areas of refractory metal 12, in the DP nickel deposition process without transferring an undesirable non-uniform appearance in the deposited nickel film 14.

It may be presumed by the forgoing description of the invention that at all points where inert standoffs 22, are in direct contact with the metal surface to be plated 12, that the metal deposition 14, may be blocked or partially blocked at those particular locations, such that significant amounts of metal 14, are not deposited under the standoff 22, leaving a potential area of little or no metal deposition 14, and an overall non-uniform coating of the depositing metal 14. With the halide transfer process of this invention this has not been the case. Rather, in a most unexpected manner, the gaseous carrier species transferred and deposited metal atoms underneath the inert standoffs 22, i.e., between the inert standoff 22, and the surface of the refractory metal 12, being plated. This plating occurred to such an extent that the resulting metal 14, deposited over the entire surface to be plated and was found to be uniform in thickness. Furthermore, surprisingly no physical evidence of where the insert standoff 22, material may have been located during the plating process was left on any of the plated surfaces.

It is conjectured that the inert standoff materials 22, and thus the DP setter 21, providing the metal source 24, and the inert standoff 22, is actually floated up by the underside deposition of metal atoms in the process, allowing the inert standoffs 22, to maintain their purpose as standoffs between the metal source 24, and the surface being plated, but not compromising the depth or quality of the depositing metal film 14. It was also discovered that this condition existed even when the DP setter 21, providing the metal source 24, and the inert standoff 22, was under a mild load as dictated by the geometrical configuration of the overall assembly in the work boat.

Several tests were done in the laboratory using various configurations of the DP setter 21, incorporating the metal source 24, and the inert standoff 22. In each case, uniform and good quality deposits of nickel and/or nickel alloy 14, on the surface of the refractory metal 12, such as, molybdenum and tungsten 12, were obtained. Furthermore, in each case, the source and sink were maintained in total isolation from each other by the DP setter 21, such that defects associated with physical contact between the metal source 24, and the receiving metal 12, were completely avoided.

As stated earlier, that the inert material 22, is basically there to prevent the physical contact between the metal receiving surface of refractory metal 12, and the source material 24.

For some applications the inert material 22, could be selected from a group comprising fibrous cloth, porous ceramic tile, coked carbon paper, glass, ceramic coated metallic screen, discrete particles, discrete fibers, fibrous material, screen mesh, to name a few.

In general terms, this invention discloses the presence of an inert material 22, between the source metal 24, such as, a nickel source 24, and the metal surface 12, to be plated regardless as to how it is applied and/or configured so long as the inert material 22, and the metal source 24, are securely bonded to each other such that they can be handled as a single item.

The process of this invention provides advantages over the prior art processes. Most importantly it provides a method whereby uniform metal films 14, are deposited that are completely free of defects associated with physical contact between the metal source 24, and the metal surface being plated in a halide transfer deposition process and free of any extraneous metal contaminants in the deposited films 14, that would affect reliability.

Additionally, this process provides a cost effective method of manufacturing, because the material for the metal source 24, and the material providing for isolation between the metal source 24, and the receiving metal 12, are handled as a single unit 21, and the unit 21, is reusable over an extended number of times.

For some applications the source metal 24, could be silver or gold, that would be deposited over silver, gold or nickel 14, which is over the refractory material 12, thus the layer 14, could comprise a single layer 14, with single or multiple materials, or multiple layers 14, with single or multiple materials.

Similarly, it should be appreciated that the iodic fluid of this invention may be used in conjunction with prior art processes to achieve improved results.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for depositing at least one source metal onto at least one receiving metal, wherein said receiving metal is secured to a substrate, comprising the steps of:
   (a) placing said substrate containing said receiving metal in a pressure chamber containing at least one source metal, and wherein at least a portion of at least one inert material is secured to said source metal,
   (b) controllably introducing at least one iodic gas into said pressure chamber from a container separate from said pressure chamber, the container containing at least one carrier gas and an iodic fluid selected from the group consisting of hydriodic acid and hydriodic acid forming fluid mixtures,
   (c) heating said pressure chamber and its contents in a non-oxidizing environment at a temperature in the range from between about 25° C. to about 1,000° C., for a period of time ranging to a maximum of about 200 minutes.
   (d) allowing said pressure chamber and its contents to cool so that said receiving metal has at least one layer of said source metal adhered thereto, and
   (e) removing said substrate containing said adhered layer of source metal to said receiving metal, from said pressure chamber.

2. The process of claim 1, wherein said at least one source metal is gold, nickel, silver or an alloy thereof.

3. The process of claim 2, wherein said nickel alloy is selected from a group, the group consisting of nickel-copper and nickel-cobalt.

4. The process of claim 1, wherein said receiving metal secured to said substrate is selected from a group, the group consisting of copper, molybdenum, nickel, tungsten, and alloys or compounds or mixtures thereof.

5. The process of claim 1, wherein said at least one source metal is selected from a group, the group consisting of nickel mesh screen, solid nickel sheet, solid nickel foil, perforated nickel sheet, a nickel lining in said chamber, nickel powder, nickel alloy mesh screen, solid nickel alloy sheet, solid nickel alloy foil, perforated nickel alloy sheet, a nickel alloy lining in said chamber and nickel alloy powder.

6. The process of claim 1, wherein said pressure chamber is pressurized to between about 1 to about 5 atmospheres.

7. The process of claim 1, wherein said substrate is selected from a group, the group consisting of ceramic, glass ceramic and multilayered ceramic.

8. The process of claim 1, wherein said non-oxidizing environment is selected from a group, the group consisting of argon, hydrogen, nitrogen, argon plus hydrogen, argon plus nitrogen, and hydrogen plus nitrogen.

9. The process of claim 1, wherein thickness of said layer of source metal over said receiving metal is between about 3 microns to about 10 microns.

10. The process of claim 1, wherein said pressure chamber contains at least one iodic fluid selected from a group, the group consisting of at least one carrier gas and hydriodic acid or hydriodic acid forming fluid mixtures.

11. The process of claim 1, wherein said at least one iodic fluid is selected from a group, the group consisting of AgI, $AuI_2$, $CoI_2$, $CuI$, $FeI_2$, $MnI_2$, $NH_4I$, $PbI_2$, $SnI_2$ and $VI_2$.

12. The process of claim 1, wherein said at least one iodic gas contains at least one iodide based salt.

13. The process of claim 1, wherein said at least one iodic gas, and said at least one source metal are contained within said pressure chamber.

14. The process of claim 1, wherein said substrate and exposed surfaces of said at least one receiving metal are cleaned prior to step (a).

15. The process of claim 1, wherein said heating of said pressure chamber and its contents are done in a furnace.

16. The process of claim 1, wherein at least one of said at least one inert material is porous.

17. The process of claim 1, wherein at least one of said at least one inert material is porous and has a porosity between about 20 percent and about 99 percent.

18. The process of claim 1, wherein at least one of said at least one inert material is a standoff.

19. The process of claim 1, wherein said at least one inert material is selected from a group, the group consisting of fibrous cloth, porous ceramic tile, coked carbon paper, glass, ceramic coated metallic screen, discrete particles, discrete fibers, fibrous material or screen mesh.

20. The process of claim 1, wherein said inert material has an average particle size up to about 100 microns.

21. The process of claim 1, wherein said inert material physically separates said at least one receiving metal from said at least one source metal.

22. A process for depositing nickel or alloys thereof on at least one receiving metal, wherein said receiving metal is secured to a substrate, comprising the steps of:
   (a) placing said substrate containing said receiving metal in a pressure chamber containing at least one discrete nickel or alloy thereof and controllably introducing into said pressure chamber at least one iodic gas from a container separate from the pressure chamber, the container containing at least one carrier gas and a fluid selected from the group consisting of hydriodic acid and hydriodic acid forming fluid mixtures as at least one iodide source, and wherein at least a portion of at least one inter material is secured to said at least one discrete nickel or alloy thereof,
   (b) heating said pressure chamber and its content in a non-oxisizing environment at a temperature in ther ange from between about 25° C to about 1,000° C, for period of time ranging to a maximum of about 200 minutes,
   (c) allowing said pressure chamber and its contents to cool so that said receiving metal has at least one layer of said nickel or alloy thereof adhered thereto, and
   (d) removing said substrate containing said adhered layer of nickel or alloy thereof to said receiving metal, from said pressure chamber.

\* \* \* \* \*